United States Patent
Bielmeier et al.

(10) Patent No.: US 10,928,466 B2
(45) Date of Patent: Feb. 23, 2021

(54) MAGNETIC RESONANCE APPARATUS AND OPERATING METHOD THEREFOR WITH MONITORING AND CONTROL OF RF ENERGY-RELEVANT OPERATING VALUE

(71) Applicant: Siemens Healthcare GmbH, Erlangen (DE)

(72) Inventors: Wolfgang Bielmeier, Erlangen (DE); Gerhard Brinker, Erlangen (DE); Swen Campagna, Engelthal (DE); Bernd Erbe, Erlangen (DE); Matthias Gebhardt, Erlangen (DE); Juergen Nistler, Erlangen (DE); Dominik Paul, Bubenreuth (DE); Carsten Prinz, Baiersdorf (DE); Gudrun Ruyters, Erlangen (DE); Stephan Stoecker, Baiersdorf (DE); Markus Vester, Nuremberg (DE)

(73) Assignee: Siemens Healthcare GmbH, Erlangen (DE)

( * ) Notice: Subject to any disclaimer, the term of this patent is extended or adjusted under 35 U.S.C. 154(b) by 788 days.

(21) Appl. No.: 15/591,451

(22) Filed: May 10, 2017

(65) Prior Publication Data
US 2017/0328966 A1 Nov. 16, 2017

(30) Foreign Application Priority Data
May 10, 2016 (DE) ..................... 10 2016 208 001.6

(51) Int. Cl.
*G01R 33/28* (2006.01)
*G01R 33/36* (2006.01)
*G01R 33/54* (2006.01)

(52) U.S. Cl.
CPC ....... *G01R 33/288* (2013.01); *G01R 33/3607* (2013.01); *G01R 33/543* (2013.01)

(58) Field of Classification Search
CPC . G01R 33/288; G01R 33/3607; G01R 33/543
USPC .......................... 324/300–322; 600/407–435; 382/128–131
See application file for complete search history.

(56) References Cited

U.S. PATENT DOCUMENTS

| | | | | |
|---|---|---|---|---|
| 3,502,963 A * | 3/1970 | Hlavka | ................. | G01R 33/46 324/310 |
| 5,153,517 A * | 10/1992 | Oppelt | ................. | G01R 33/341 324/318 |
| 8,442,616 B2 * | 5/2013 | Nistler | ................. | G01R 33/288 600/410 |
| 9,201,127 B2 * | 12/2015 | Kumar | ................. | G01R 33/3628 |
| 9,500,727 B2 * | 11/2016 | Sohn | ................. | G01R 33/34092 |
| 9,547,064 B2 | 1/2017 | Biber et al. | | |

(Continued)

OTHER PUBLICATIONS

International Standard 60601-2-33, with Amendment 2, "Particular requirements for the basic safety and essential performance of magnetic resonance equipment for medical diagnosis," IEC (2015).

*Primary Examiner* — Dixomara Vargas
(74) *Attorney, Agent, or Firm* — Schiff Hardin LLP

(57) ABSTRACT

In a magnetic resonance apparatus and a method for operation thereof, at least one electrical operating value of at least one predetermined component of the apparatus is captured and, as a function of the at least one operating value, at least one coil operating value of a transmitting coil arrangement of the magnetic resonance apparatus is controlled for the purpose of limiting a B1 value.

16 Claims, 8 Drawing Sheets

(56) References Cited

U.S. PATENT DOCUMENTS

| | | | |
|---|---|---|---|
| 9,671,481 B2 | 6/2017 | Ugurbil | |
| 9,791,489 B2* | 10/2017 | Bottomley | G01R 21/00 |
| 10,048,347 B2* | 8/2018 | Kudielka | A61B 5/055 |
| 2010/0167668 A1* | 7/2010 | Nistler | G01R 33/288 |
| | | | 455/101 |
| 2010/0327868 A1* | 12/2010 | Gebhardt | G01R 33/288 |
| | | | 324/307 |
| 2011/0295531 A1* | 12/2011 | Nistler | G01R 33/288 |
| | | | 702/60 |
| 2013/0082707 A1* | 4/2013 | Biber | G01R 33/583 |
| | | | 324/309 |
| 2013/0285659 A1* | 10/2013 | Sohn | G01R 33/34092 |
| | | | 324/314 |
| 2016/0003927 A1* | 1/2016 | Kudielka | G01R 33/5673 |
| | | | 600/413 |
| 2016/0033591 A1 | 2/2016 | Leussler et al. | |
| 2018/0088193 A1* | 3/2018 | Rearick | G01R 33/445 |

\* cited by examiner

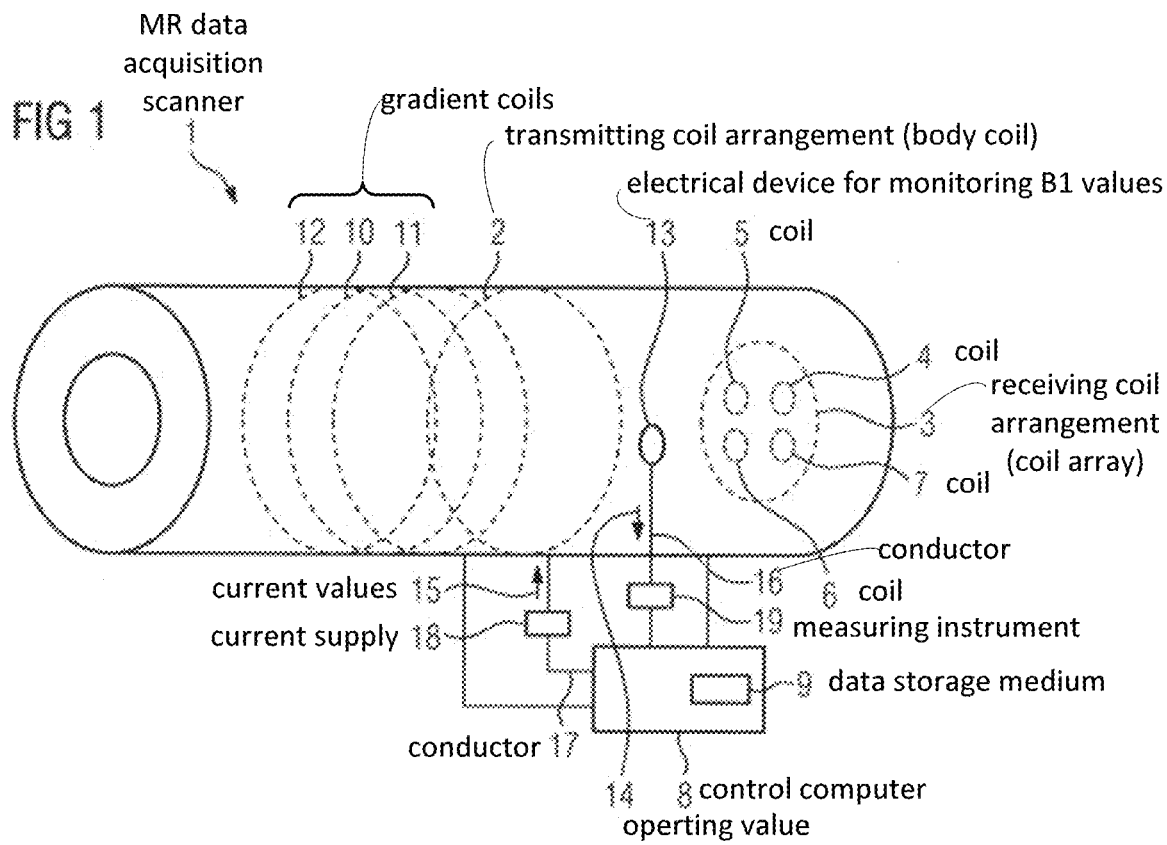
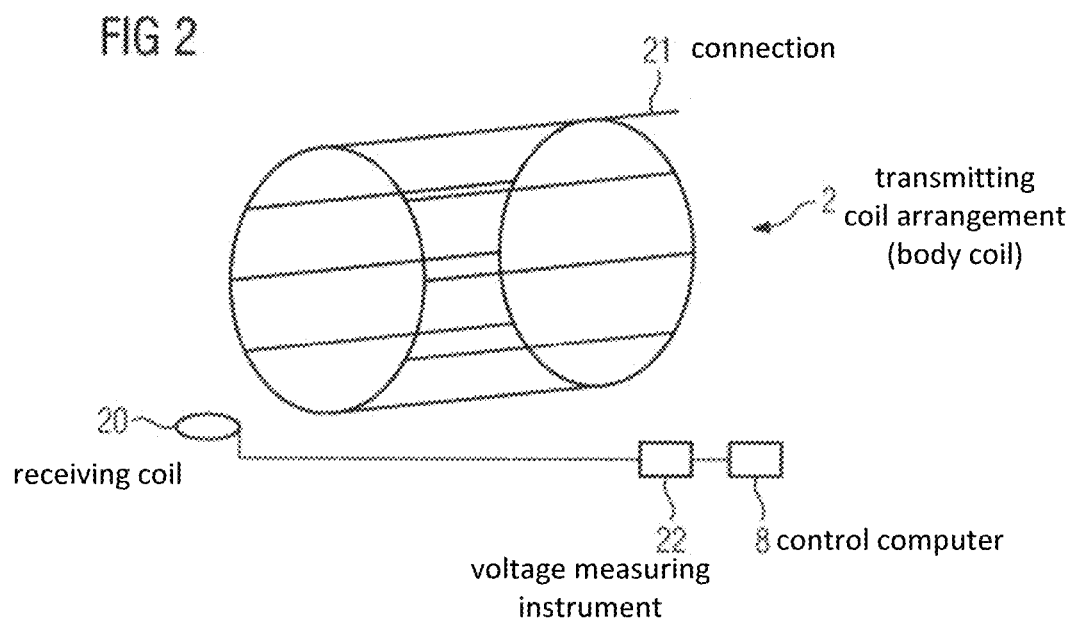

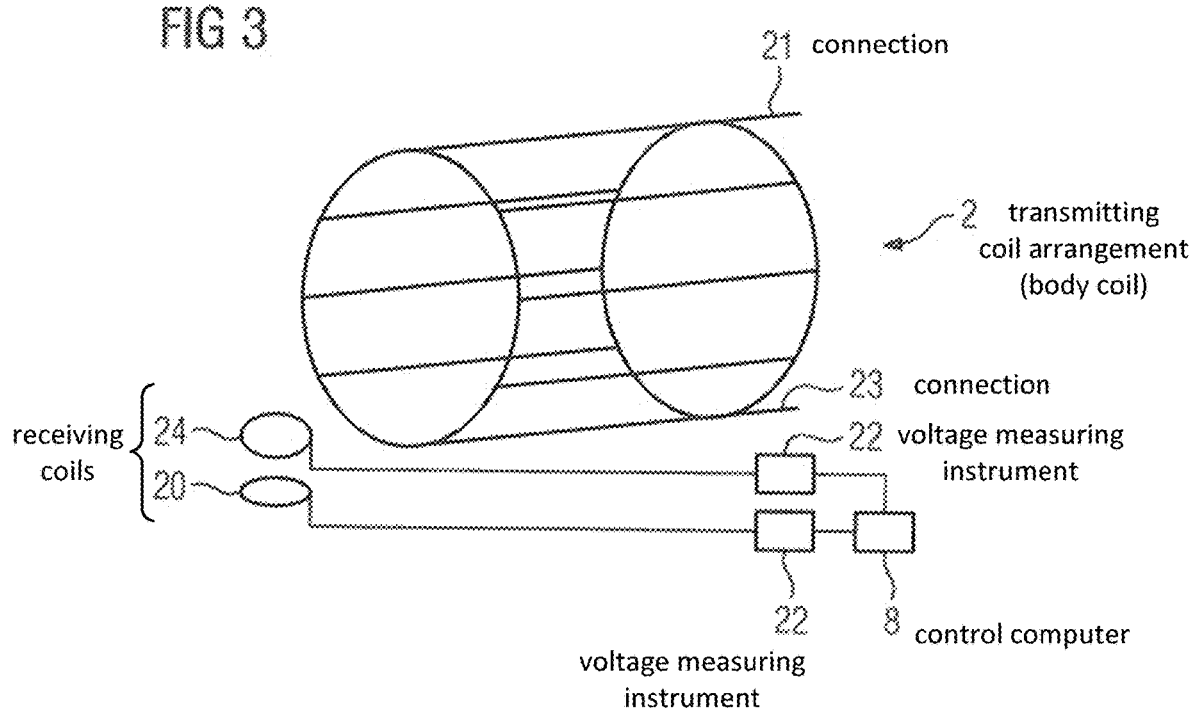
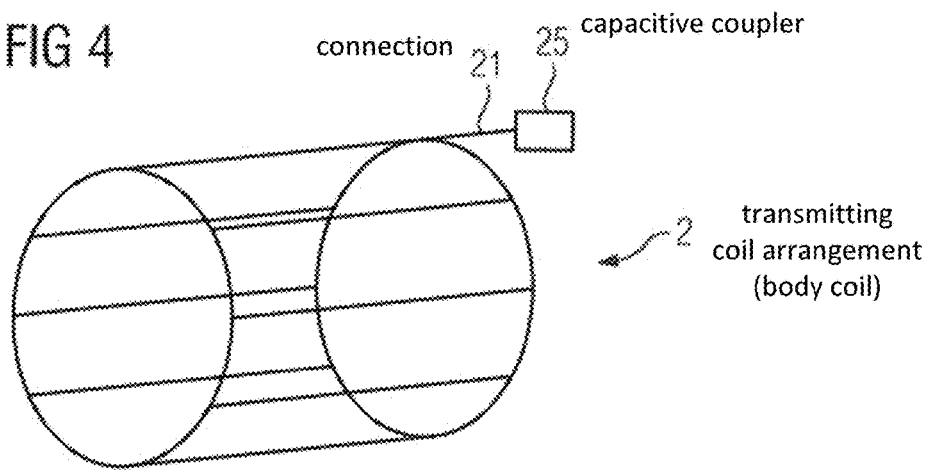

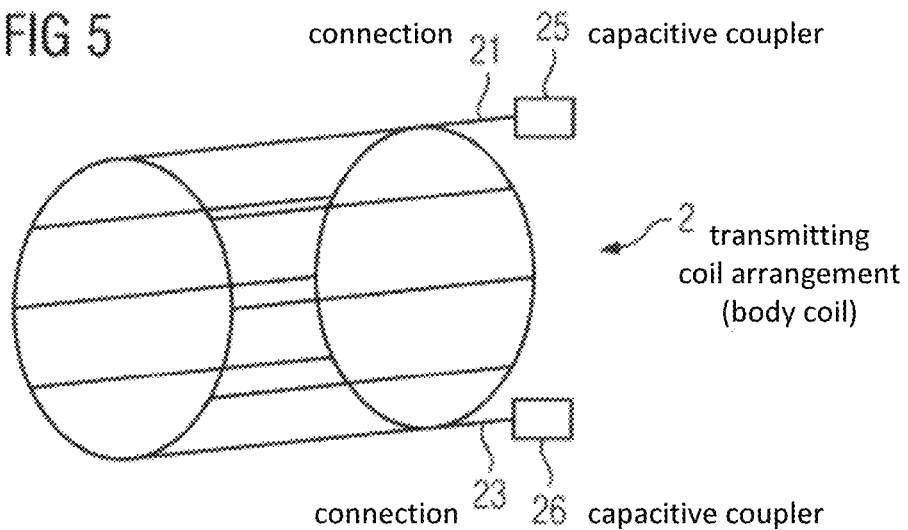
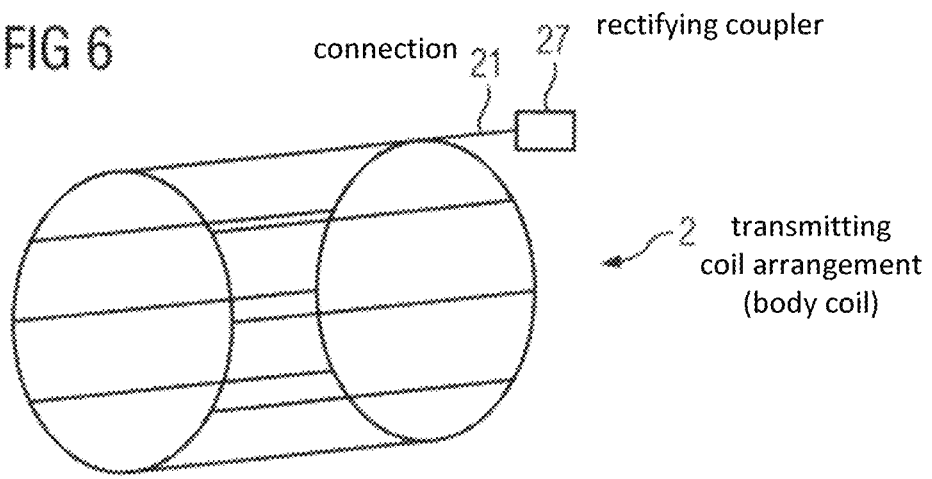

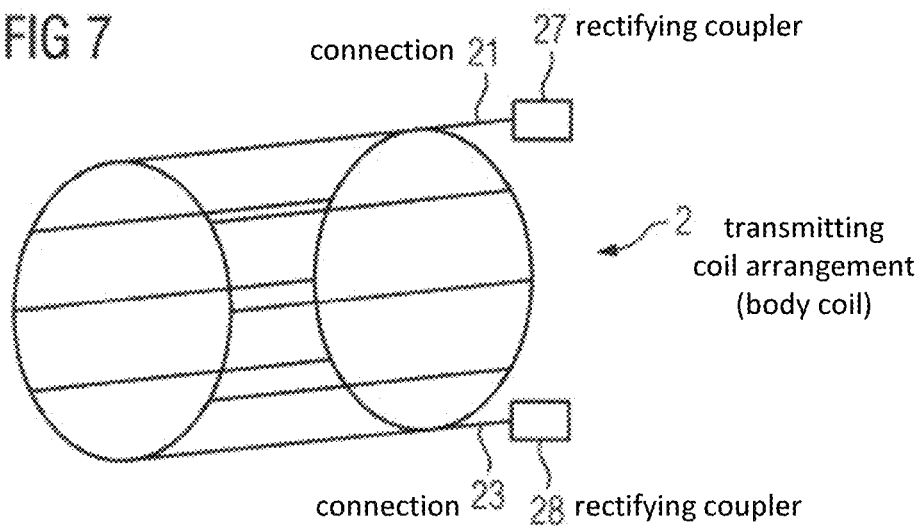

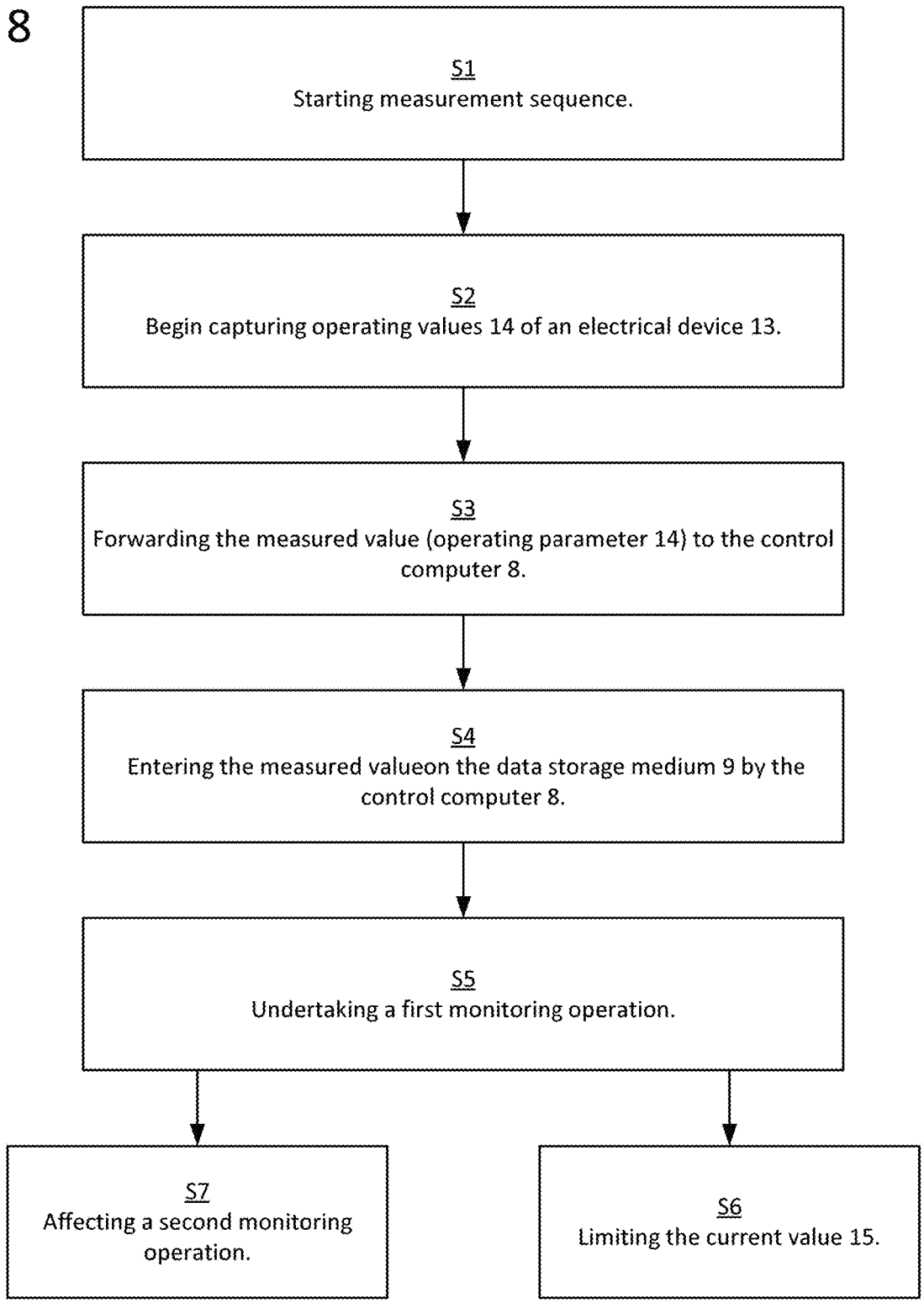

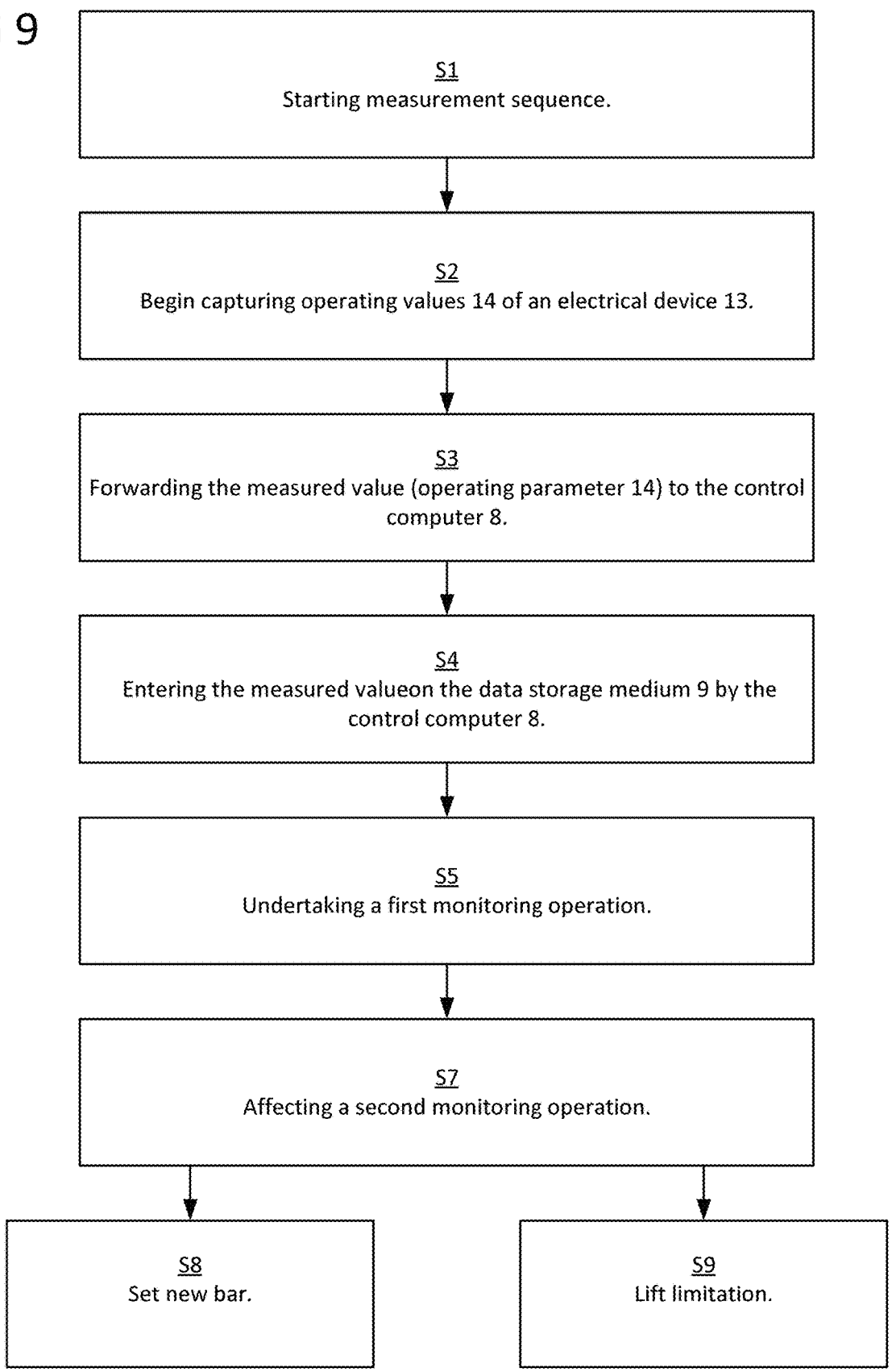

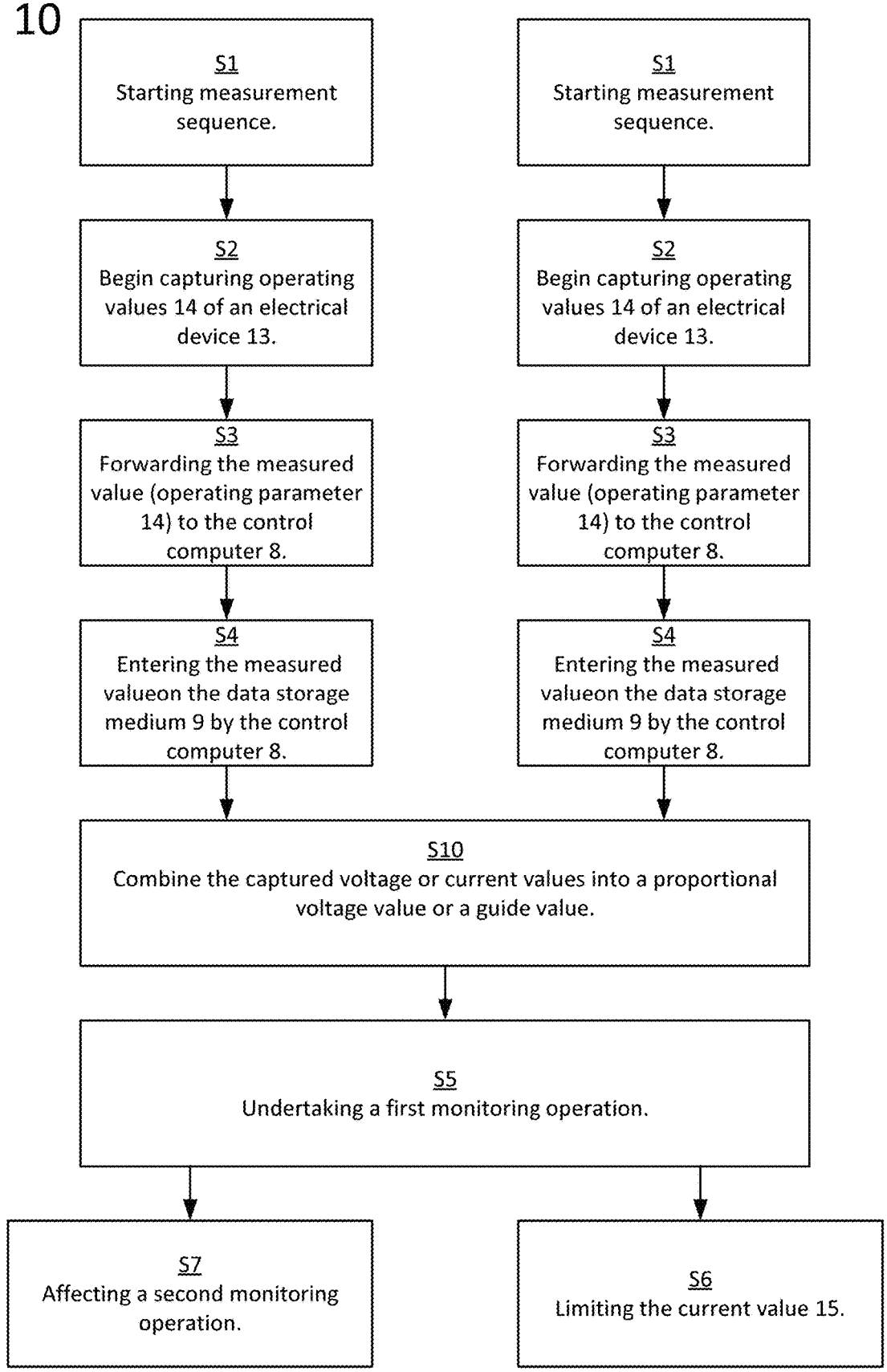

MAGNETIC RESONANCE APPARATUS AND OPERATING METHOD THEREFOR WITH MONITORING AND CONTROL OF RF ENERGY-RELEVANT OPERATING VALUE

BACKGROUND OF THE INVENTION

Field of the Invention

The present invention concerns a magnetic resonance apparatus and operating method, wherein factors that are relevant to the radiation of radio-frequency (RF) energy are monitored and controlled.

Description of the Prior Art

One aspect of operating magnetic resonance systems is safety. In this regard, a number of variables play a role, one of them being the magnetic fields that are produced during an examination. In this regard, there are three different fields to take into consideration, specifically the static B0 field, the B1 radio-frequency field, and gradient fields. In this regard, B1 radio-frequency fields are considered in greater detail below.

In connection with MR measurements, B1 radio-frequency fields or B1 fields are in the form of radio-frequency pulses or RF pulses. These are used to deflect the magnetization of nuclear spins of a subject from the rest position established by the basic magnetic field, by a desired flip angle. To radiate such B1 fields, one or more transmitting coils are supplied with current.

The flip angle achieved is dependent on the duration of the RF pulse and the pulse profile. In this regard, there is an interaction between the B1 field of the radio-frequency pulse and the tissue being investigated, as a result of which the magnetization is deflected.

The spatial distribution of the B1 field of a radio-frequency pulse can be represented by using a so-called B1 map.

However, the B1 fields interact not only with tissue but also with implants.

Moreover, B1 fields heat tissue with which they interact. This is taken into account by the SAR, or specific absorption rate.

In the context of MR safety, it is consequently a familiar matter to estimate the effect of the B1 fields of RF pulses or measuring sequences, and to limit them.

Starting from B1 maps that have been recorded using a phantom, permissible parameters are defined for individual sequences.

Alternatively, B1 maps can be created directly from the examination subject in order to be able to define the recording parameters more precisely.

This procedure is costly, because limits for recording parameters for a large number of sequences have to be defined starting from data that has to be acquired.

SUMMARY OF THE INVENTION

An object of the present invention is to provide a method, a magnetic resonance apparatus, and a non-transitory, computer-readable data storage medium, with which it is possible to simplify the monitoring of the B1 fields in the context of MR safety.

This object is achieved in accordance with the invention by a method for operating a magnetic resonance apparatus, in which at least one electrical operating value of at least one predetermined component of the apparatus is acquired, and as a function of the at least one operating value, at least one coil operating value of a transmitting coil of the magnetic resonance apparatus is controlled for the purpose of limiting a B1 value.

The basis of the invention is to no longer monitor the B1 fields starting from the B1 field itself, e.g. with a coil map, but instead to start from an electrical operating value. Acquiring or detecting electrical operating values is comparatively simple, their analysis in real time is feasible, and as a result extremely flexible use is achieved.

In this regard, an electrical component is any device present in or on the magnetic resonance apparatus during the magnetic resonance examination, from which electrical operating values can be captured.

Electrical operating values can be, for example, voltage, current, resistance, inductance, etc.

In this regard, the electrical device can be supplied with current but it does not have to be.

Preferably, the electrical component is arranged in the magnetic resonance apparatus, such as in the data acquisition scanner thereof.

Starting from the operating value or operating values of the electrical component or electrical components, a coil operating value of a transmitting coil arrangement of the magnetic resonance apparatus is controlled. The coil operating value can be the current, for example. The lower the current flowing through a coil, the smaller is the B1 field that is generated.

The transmitting coil arrangement can have one or more coils. These can be realized independently of the receiving coil arrangement. The transmitting and receiving coil arrangement can be implemented by the same coil, but there can also be separate coil arrangements. For example, the transmitting coil arrangement can be realized in the form of a body coil and the receiving coil arrangement in the form of a local coil array. Naturally, only the current of the transmitting coil arrangement influences the strength of the B1 field.

In this regard, "control" is understood to be a monitoring operation such that the possible value range of the coil operating value is limited. In particular, it is possible to monitor the coil operating value to ensure that predetermined maximum values are not exceeded.

The at least one operating value is captured with a measuring instrument.

In an embodiment, the captured electrical operating value is an operating value that is proportional to the current of the transmitting coil arrangement. The corresponding value of the B1 field is therefore also known indirectly. As a result, threshold values can be derived for the operating variable, which result in a limiting of the current of the transmitting coil arrangement.

Alternatively, the operating value can be captured as an electrical operating value from which a proportional value can be derived or estimated.

In the case of transmitting coil arrangements that operate with circular polarization, it is advantageous to capture two operating values. In this regard, the individual operating values are not proportional, but a proportional value that can be calculated from same. This is presented in more detail below.

At least one voltage value can be captured as an operating value. This can be a voltage or a voltage drop. The voltage value to be considered is designated as PU below in equations as an abbreviation for proportional voltage, since a number of voltage values have to be aggregated in the case of a number of implementation variants. To avoid any lack of clarity, the relevant and, where appropriate aggregated, value is labeled with the aforementioned designation. This involves the special case of the guide value which can be an aggregated current value or voltage value.

Voltages are differences in potential without a current flow; voltage drops take place with a current flow. In this regard, both voltages and voltage drops can be captured in the context of capturing a number of operating values.

The voltage value of at least one receiving coil can be captured. Receiving coils, also referred to as "pickup coils", are coils in which a voltage can be induced. These are placed in the vicinity of the transmitting coil arrangement. The voltage induced in the receiving coil is directly proportional to the applied B1 field.

Whenever the transmitting coil arrangement is operating in a circularly polarized mode or an elliptical mode, two receiving coils are preferably used which are arranged perpendicular to each other. Thus two voltage values, and therefore two operating values, are captured simultaneously. Thus it is possible to record a number of operating values not only in terms of time, but also with a view to the quantity of measuring points. These simultaneously recorded voltage values need to be combined in to a proportional voltage value as a guide value.

Alternatively, at least one voltage value can be measured by at least one rectifying coupler. Rectifying couplers are used for feeding power in to a conductor. This involves a rectifying coupler for at least partly feeding power in to the transmitting coil arrangement.

Preferably, a phase-sensitive voltage measuring instrument can be used in this regard. These measure complex voltage values. The voltage value PU to be considered as an operating value can be captured out of the complex voltage values which have been measured at the rectifying coupler, it being necessary to take the complex constants A1 and A1 into account. A1 and A2 describe the transformation between the measuring point and the connection point of the transmitting coil arrangement:

$$PU = A1 * U_{forw} + A2 * U_{refl}.$$

If the voltage measuring instrument is not phase-sensitive, it is also possible to use estimates. The first estimate does not use any phase information at all:

$$PU = |A1| * |U_{forw}| + |A2| * |U_{refl}|.$$

In the second, a "worst-case" phase difference is taken into account:

$$PU = |A1| * |U_{forw}| + |A2| * |U_{refl}| * \cos(\alpha).$$

∠ α is the difference in angle which can occur in the worst case in this regard.

In the case of a circularly or elliptically polarized coil, there are two connections, two rectifying couplers, and therefore two voltage values $PU_0$ and $PU_1$, each of which is derived from the equation just specified. The proportional voltage value PU is then given as:

$$PU = \sqrt{(|PU_0|^2 + |PU_1|^2)}$$

As a further alternative, the voltage value can be measured at at least one connection of the transmitting coil arrangement. In this regard, only connection points for the incoming lead are considered in the present invention, not other connection points. In the case of transmitting coil arrangements with circularly or elliptically polarized waves, there are precisely two connection points for incoming leads; in the case of other transmitting coil arrangements precisely one connection point.

Preferably, at least one current value can be captured as an electrical operating value. Currents can also be captured easily and are suitable for real-time analyses.

Preferably, the current or at least a current value can be measured at at least one connection point of the transmitting coil arrangement. As described above, transmitting coil arrangements with circularly or elliptically polarized waves have precisely two connection points, and other transmitting coil arrangements precisely one connection point.

The electrical operating value can be measured by using a capacitive coupler. This is preferable in the case of measurements at the connection points.

A peak value of the coil operating value of the transmitting coil arrangement can be limited. As described, the operating values are used so as to prevent harmful effects of B1 fields. B1 values coming into consideration in this regard are B1 peak values or B1 average values over a predetermined time period. Since the coil operating values, in particular the supplied current or the current applied at the transmitting coil arrangement, are proportional to the B1 field generated, a limiting of the B1 field can be achieved by a limiting of the coil operating value. Peak or maximum values, or average values, can then be limited consistently in each case.

In an embodiment, the average value is formed over operating values with a time duration of 10 sec.

In the case of average values, a number of operating values or guide values need to be taken into account in the time profile.

Preferably, a change in the peak value or the average value of the coil operating value of the transmitting coil arrangement can be limited. This results in a limiting of the change in the B1 field dB1/dt.

Preferably, given a B0 field strength of the magnetic resonance system of more than 1.5 T, an additional safety factor can be used. A safety factor means that the effect of the B1 field, which continues to bear a relationship to the operating value, is seen as being dependent on the strength of the B0 field. So an adequate limiting of the coil operating value at 1.5 T may no longer be adequate at 3 T for example, although the strength of the B1 field is the same. It is for this that the safety factor is used. So this results in a stronger limiting of the coil operating value and therefore of the B1 field.

In an embodiment, the threshold values can be calculated from measured subject data. The threshold value $PU_{limit,\,max}$ for the maximum value of the voltage and therefore of the B1 field is given as:

$$PU_{limit,max} = \min(PU) * B1_{standard} / B1_{measured}.$$

Similarly, a threshold value for the average value $PU_{limit,\,average}$ is given as:

$$PU_{limit,average} = \min(PU) * B1_{average,standard} / B1_{average,measured}.$$

An advantage of the inventive method is that it requires no modifications to the measuring sequences. The method just results in a small monitoring sequence following which the applied coil current is monitored. Thus, a magnetic resonance apparatus can be designed with the very least cost so as to make it implant-compatible for any desired implants.

In this regard, the implementation of the aforesaid method in the control computer can be effected in the form of software or also in the form of (hardwired) hardware.

The present invention also encompasses a non-transitory, computer-readable data storage medium encoded with programming instructions that, when the storage medium is loaded into a control computer or processor of a magnetic resonance apparatus, cause the control computer or processor to implement the method as described above when the programming instructions are executed.

The invention also concerns a magnetic resonance apparatus with a control computer and at least one measuring instrument for capturing an electrical operating value of at least one predetermined component of the apparatus, as a function of the at least one electrical operating value at least one coil operating value of a transmitting coil arrangement of the magnetic resonance apparatus is controlled by the control computer for the purpose of limiting a B1 value.

The magnetic resonance apparatus can have an input interface for entering an implant type, an implant model or some other implant information into the computer. With the use of a stored set of performance data, threshold values for a B1 maximum value and a B1 average value can then be set in an implant-specific manner by using the control computer.

Alternatively the magnetic resonance system can have a setting option with which just the parameter "implant" is activated. Then the threshold values are set to a value that is non-critical for all implants.

As a consequence of the reduction of the B1 field, a smaller flip angle is produced. This results in a lower SNR and, depending on the measuring sequence, possibly artifacts.

Embodiments of the magnetic resonance apparatus correspond to the embodiments of the method as described above.

BRIEF DESCRIPTION OF THE DRAWINGS

FIG. 1 schematically illustrates a magnetic resonance apparatus of the type that can be operated to implement the inventive method.

FIG. 2 shows a transmitting coil arrangement in a first embodiment of the invention.

FIG. 3 shows a transmitting coil arrangement in a second embodiment of the invention.

FIG. 4 shows a transmitting coil arrangement in a third embodiment of the invention.

FIG. 5 shows a transmitting coil arrangement in a fourth embodiment of the invention.

FIG. 6 shows a transmitting coil arrangement in a fifth embodiment of the invention.

FIG. 7 shows a transmitting coil arrangement in a sixth embodiment of the invention.

FIG. 8 is a flowchart of a first embodiment of a method for operating a magnetic resonance apparatus in accordance with the invention.

FIG. 9 is a flowchart of a second embodiment of a method for operating a magnetic resonance apparatus in accordance with the invention.

FIG. 10 is a flowchart of a third embodiment of a method for operating a magnetic resonance apparatus in accordance with the invention.

DESCRIPTION OF THE PREFERRED EMBODIMENTS

Figure 11:
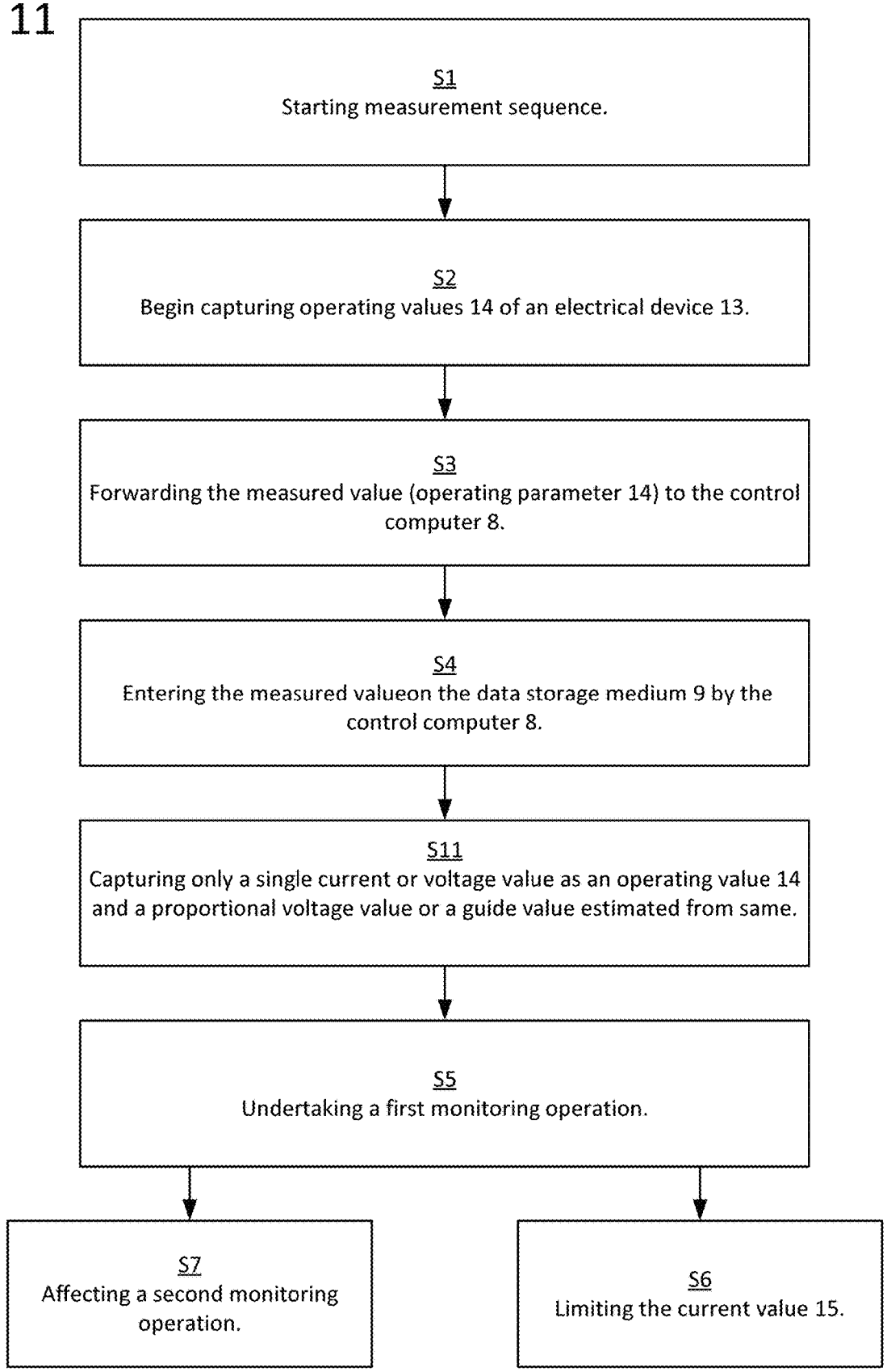
FIG. 11 is a flowchart of a fourth embodiment of a method for operating a magnetic resonance apparatus in accordance with the invention.

FIG. 1 schematically shows a magnetic resonance data acquisition scanner 1 of a magnetic resonance apparatus. The scanner 1 has a transmitting coil arrangement 2 in the form of a body coil, and a receiving coil arrangement in the form of a coil array 3 with coils 4, 5, 6, and 7. A control computer 8 controls the magnetic resonance apparatus, and in particular the scanner 1.

Furthermore, a non-transitory data storage medium 9 is provided, as part of the control computer 8, or independent thereof but which can be loaded into the control computer 8. The data storage medium 9 is encoded with program code that cause the control computer 8 to operate the apparatus to conduct magnetic resonance measurements in accordance with the invention. The data storage medium 9 can also be used to store acquired data.

The transmitting coil arrangement 2 generates B1 fields in order to induce magnetization in the subject, i.e. in order to flip certain nuclear spins by a desired flip angle.

The coil array 3 is used only for reading out the measurement signal. The coils 4, 5, 6, and 7 of the coil array 3 read out (detect) the measurement signal simultaneously. In place of the coil array 3, a single coil can be used as a detection coil.

Furthermore, gradient coils 10, 11, and 12 are needed for carrying out imaging examinations. The gradient coils 10, 11, and 12 generate gradient fields in three directions, respectively. These are usually designated by x, y, and z. These are superimposed on the gradients used in a recording sequence, which apply in the read, phase, and slice selection directions. In other words, depending on their position, the gradients used in a sequence are generated by the gradients in the directions x, y and z individually or in any desired combination.

In the context of MR safety, both the B1 values and the gradient fields have to be monitored. The magnetic resonance scanner 1 has at least one electrical device 13 for monitoring the B1 values. At least one electrical operating value 14 can be captured (detected) by the device 13. The control computer 8 analyzes the captured operating value or values 14, and monitors the applied B1 field as a function of the operating values 14, by controlling current values 15 of the transmitting coil arrangement 2. For this purpose, the control computer 8 is connected by conductors 16 and 17 both to the device 13 and to a current-supply 18 that supplies current to the transmitting coil arrangement 2.

A measuring instrument 19 is situated between the device 13 and the control computer 8. The measuring instrument 19 measures the captured operating values 14. Exemplary embodiments of the measuring instrument 19 are described below.

FIG. 2 shows a first embodiment of the device 13. In this regard, for simplification, it is primarily those elements that are shown in more detail than in FIG. 1. The device 13 is in the form of a receiving coil 20 in this embodiment. The transmitting coil arrangement 2 is in the form of a birdcage resonator and has a connection 21 as an incoming lead. As in the following figures as well, further connections are not shown.

The receiving coil 20 can be mounted mechanically on the transmitting coil arrangement 2. In electrical terms, the receiving coil 20 is connected to the measuring instrument 19, e.g. to a voltage measuring instrument 22.

The voltage measuring instrument 22 transfers the measured voltages to the control computer 8 as operating values 14. On the basis of the operating values 14, the control computer 8 then controls the current values 15. This can be effected such that, in the event of a threshold value being exceeded by an operating value 14 or an average value of a number of operating values 14, the current is set to a predetermined value. Alternatively, the current can be successively reduced or held at the existing value. The threshold value has to be chosen such that the applied B1 field still lies just in the permissible range.

FIG. 3 shows an alternative embodiment of the transmitting coil arrangement 2. This emits circularly polarized waves and consequently has two connections 21 and 23. Two receiving coils 20 and 24 are then also present for generating operating values 14. In this embodiment, the receiving coils 20 and 24 are positioned at a right angle to each other, but they do not need to be arranged next to each other. The receiving coil 24 is also connected to a voltage measuring instrument 22, which in turn communicates with the control computer 8.

To obtain a proportional voltage value proportional to the B1 field, the two voltage signals are as specified above in this case. This can take place by a summing element or inside the control computer 8.

In this case, two electrical devices 13, specifically the receiving coils 20 and 24, are present.

FIG. 4 shows a further alternative for capturing operating values 14. In this embodiment, a capacitive coupler 25 is situated at the incoming lead connection 21. Either a current or a voltage can be tapped at the capacitive coupler 25. The values tapped in this way are passed on to the control computer 8 as operating values 14. In this embodiment, the capacitive coupler 25 is the electrical device whose operating value is captured.

FIG. 5 shows an alternative in which, unlike in FIG. 4, the transmitting coil arrangement 2 operates with circularly polarized waves. Accordingly, two incoming leads and accordingly two incoming lead connections 21 and 23 are present, at which capacitive couplers 25 and 26 respectively tap current or voltage in each case.

In this embodiment also, the tapped values are used for forming a value proportional to the B1 field.

FIG. 6 shows a further embodiment of the electrical device 13, in the form of a rectifying coupler 27. A voltage value can be tapped at the rectifying coupler 27 by a voltage measuring instrument 22. This is forwarded to the control computer 8 as an operating value 14.

The transmitting coil arrangement 2 shown in FIG. 6 can also be modified such that it operates with circularly polarized waves. This is represented in FIG. 7. In this case, two rectifying couplers 27 and 28 are used. The voltage values tapped at the rectifying coupler 27 and 28 again have to be offset in order to obtain a value proportional to the B1 field generated by the transmitting coil arrangement 2.

FIG. 8 is a flowchart for operating the magnetic resonance scanner 1. More precisely, this involves an operation in order to acquire a magnetic resonance data record.

In step S1, a measurement sequence is started. At this time point, adjustment measurements such as the determination of the resonance frequency have already been undertaken.

A measuring sequence involves a defined sequence of RF pulses, gradient switching operations, waiting times, and acquisition windows. A large number of sequences is known, including FLASH, TSE, TrueFisp, etc.

Following the start of the measuring sequence, operating values 14 of an electrical device 13 begin to be captured in step S2. In a first alternative, it is assumed that one of the embodiments as shown in FIG. 2, 4 or 6 is present, and so the captured voltage or current value is proportional to the B1 field generated by the transmitting coil arrangement 2.

A measuring instrument 19 is used for capturing the values.

In step S3, the measured value, that is to say the operating parameter 14, is forwarded to the control computer 8.

Subsequently, the measured value is entered on the data storage medium 9 by the control computer 8 in step S4.

In step S5, a first monitoring operation is undertaken. The operating value 14 is compared with a threshold value. If the threshold value has been exceeded, a limiting of the current value 15 follows in step S6.

Otherwise, the process skips to step S7, in which a second monitoring operation is affected. In this regard, an average value is formed from the existing and stored operating values 14 and this average value is compared with a second threshold value. If the second threshold value has been exceeded, a limiting of the current value 15 follows in step S6.

If the second threshold value has also not been exceeded, the process goes back to step S1.

The filing of the operating value 14 on the data storage medium 9 can also not be effected until now or at some other desired time point after its capture. In particular, the measuring instrument 19 can also store the operating value 14 prior to its being passed on to the control computer 8. The control computer 8 then fetches the operating value 14 from the data storage medium 9.

The oldest stored operating value 14 can also be erased. Only a fixed quantity of values is ever needed for aiming the average value; surplus values can be removed.

If the operating values are just filed in the working memory, this is erased automatically at some time. A separate erase operation is consequently not necessary.

The monitoring operations can also be effected the other way around. The monitoring operation on the peak value can also be effected as the second monitoring operation.

In place of skipping from step S5 straight to step S6 in the event of the first threshold value being exceeded, the steps S5 and S7 can also be run through first. Then, as in the case of both threshold values being exceeded, a comparison of the values to be set for the coil operating value follows as an intermediate step, wherein the lower value is selected, and subsequently the controlling operation on the current value 15 if needed in step S6.

FIG. 9 is a flowchart for the eventuality that the current value 15 has already been limited. In this case, steps S1 through S3 or S4 are executed as described. Then steps S5 and S7 follow directly one after another, wherein the operating value 14 and the average value of the operating values are compared with the threshold values and a new limit value or the ending of the limiting operation is derived from same. Then the new bar is set in step S8 or the limitation lifted in step S9.

The process then goes back to step S1.

FIG. 10 is a flowchart of another embodiment, relative to FIGS. 3, 5, and 7. As an addition to FIG. 8, the steps S2 and where applicable S3 and S4 take place in parallel for two incoming leads. After step S2, the captured voltage or current values need to be combined in to a proportional voltage value or more generally in to a guide value as step S10. This can take place at any time point prior to the first monitoring operation, thus prior to step S5. In FIG. 10, as an example, the combining operation is shown after the storing operation, thus after step S4. Otherwise, the process is as described in reference to FIG. 8.

FIG. 11 is an alternative flowchart to FIG. 10, which can likewise be employed in the case of a set-up according to FIG. 3, 5 or 7. In this regard, only a single current or voltage value is captured as an operating value 14 and a proportional voltage value or more generally a guide value estimated from same as step S11. Here also, step S11 can take place at any desired time point between the capturing of the value in step S2 and prior to the first monitoring operation in step S5.

It is also possible to fall back on stored operating values or guide values for the purpose of estimating the guide value. These then have to be stored separately.

It is also possible to fall back on other operating parameters, such as the position of the selected slice etc., for the purpose of estimating.

The inventive method and the inventive magnetic resonance apparatus are closely interlinked, and that features of the invention described as aspects of the method apply as well to the magnetic resonance apparatus.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for operating a magnetic resonance (MR) apparatus, said MR apparatus comprising an MR data acquisition scanner comprising a plurality of scanner components which include at least one coil that is operable to radiate radio-frequency (RF) energy, said method comprising:
   determining the RF energy radiated by said coil by detecting at least one electrical operating value of at least a predetermined one of said scanner components using a capacitive coupler that interacts with said at least one predetermined scanner component;
   providing an input signal, representing the detected at least one electrical operating value, to a processor and, in said processor, generating a coil control signal, dependent on said input signal, that limits RF energy radiated by said coil; and
   from said processor, emitting said coil control signal in order to control at least one coil operating value of said coil, and thereby limit the RF energy radiated by said coil in accordance with said control signal.

2. A method as claimed in claim 1 comprising detecting, as said at least one electrical operating value, an operating value that is proportional to a current associated with operation of said coil.

3. A method as claimed in claim 1 comprising detecting a voltage value as said at least one electrical operating value.

4. A method as claimed in claim 3 wherein said plurality of scanner components include a receiving coil, that receives RF energy radiated by said coil, and detecting said at least one operating value as a voltage value of said receiving coil.

5. A method as claimed in claim 3 wherein said plurality of scanner components include a rectifying coupler, and detecting said at least one electrical operating value as a voltage value of said at least one rectifying coupler.

6. A method as claimed in claim 3 wherein said plurality of scanner components comprise an electrical connection, and detecting said at least one operating value as a voltage value at said at least one electrical connection.

7. A method a claimed in claim 1 comprising detecting a current value as said at least one electrical operating value.

8. A method as claimed in claim 7 wherein said plurality of scanner components comprise an electrical connection, and detecting said at least one operating value as a current value at said at least one electrical connection.

9. A method as claimed in claim 1 comprising, in said processor, generating said coil control signal so as to limit a maximum value of the coil operating value controlled by said coil control signal.

10. A method as claimed in claim 1 comprising, in said processor, generating said coil control signal so as to limit an average value of the coil operating value controlled by said coil control signal.

11. A method as claimed in claim 1 wherein said MR data acquisition scanner comprises, as one of said plurality of scanner components, a basic field magnet that produces a basic magnetic field in said MR data acquisition scanner of more than one 1.5 T, and wherein said method comprises, in said processor, generating said coil control signal with a safety factor that limits said coil operating value controlled by said coil control signal by more than a nominal value required to limit said RF energy.

12. A method as claimed in claim 1 comprising generating said coil control signal with a safety factor that limits said coil operating value controlled by said coil control signal by more than a nominal value required to limit said RF energy.

13. A non-transitory, computer-readable data storage medium encoded with programming instructions, said storage medium being loaded into a computer of a magnetic resonance (MR) apparatus comprising an MR data acquisition scanner comprising a plurality of scanner components which include at least one coil that is operable to radiate radio-frequency (RF) energy, and said programming instructions causing said computer to:
   operate a detector to detect at least one electrical operating value of at least a predetermined one of said scanner components to thereby determine, using a capacitive coupler that interacts with said at least one predetermined scanner component, the RF energy radiated by said coil;
   receive an input signal, representing the detected at least one electrical operating value, and generate a coil control signal, dependent on said input signal, that limits RF energy radiated by said coil; and
   emit said coil control signal in order to control at least one coil operating value of said coil, and thereby limit the RF energy radiated by said coil in accordance with said control signal.

14. A non-transitory, computer-readable data storage medium as claimed in claim 13, wherein said programming instructions causes said computer to generate said coil control signal with a safety factor that limits said coil operating value controlled by said coil control signal by more than a nominal value required to limit said RF energy.

15. A magnetic resonance (MR) apparatus comprising:
   an MR data acquisition scanner comprising a plurality of scanner components which include at least one coil that is operable to radiate radio-frequency (RF) energy;
   a detector that detects at least one electrical operating value of at least a predetermined one of said scanner components to thereby determine, using a capacitive coupler that interacts with said at least one predetermined scanner component, the RF energy radiated by said coil;
   a processor provided with an input signal, representing the detected at least one electrical operating value, to a processor, and said processor being configured to generate a coil control signal, dependent on said input signal, that limits RF energy radiated by said coil; and
   said processor being configured to emit said coil control signal in order to control at least one coil operating value of said coil, and thereby limit the RF energy radiated by said coil in accordance with said control signal.

16. An MR apparatus as claimed in claim 15 wherein said processor is configured to generate said coil control signal with a safety factor that limits said coil operating value controlled by said coil control signal by more than a nominal value required to limit said RF energy.

* * * * *